US012610740B2

(12) United States Patent　　(10) Patent No.:　US 12,610,740 B2
Choi et al.　　(45) Date of Patent:　Apr. 21, 2026

(54) THERMOELECTRIC DEVICE

(71) Applicant: LG INNOTEK CO., LTD., Seoul (KR)

(72) Inventors: Man Hue Choi, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/728,582

(22) PCT Filed: Jan. 26, 2023

(86) PCT No.: PCT/KR2023/001199
§ 371 (c)(1),
(2) Date: Jul. 12, 2024

(87) PCT Pub. No.: WO2023/146302
PCT Pub. Date: Aug. 3, 2023

(65) Prior Publication Data
US 2025/0089565 A1　　Mar. 13, 2025

(30) Foreign Application Priority Data

Jan. 28, 2022　(KR) ......................... 10-2022-0013193

(51) Int. Cl.
H10N 10/17　　(2023.01)
H10N 10/82　　(2023.01)
H10N 19/00　　(2023.01)

(52) U.S. Cl.
CPC ............. H10N 10/17 (2023.02); H10N 10/82 (2023.02); H10N 19/00 (2023.02)

(58) Field of Classification Search
CPC ......... H10N 10/17; H10N 10/82; H10N 19/00
See application file for complete search history.

(56) References Cited

U.S. PATENT DOCUMENTS 4,802,929 A * 2/1989 Schock .................. H10N 10/17
136/202
4,907,060 A * 3/1990 Nelson ................... H10N 10/17
257/793

(Continued)

FOREIGN PATENT DOCUMENTS

JP　　2017-147267　　8/2017
KR　　10-0620913　　9/2006

(Continued)

OTHER PUBLICATIONS

International Search Report dated Apr. 26, 2023 issued in Application No. PCT/KR2023/001199.

*Primary Examiner* — Sadie White
(74) *Attorney, Agent, or Firm* — KED & ASSOCIATES, LLP

(57)　　ABSTRACT

A thermoelectric device according to an embodiment of the present invention includes: a duct; a first thermoelectric module disposed on the duct and including a thermoelectric element; and a shield member disposed on the first thermoelectric module, wherein the first thermoelectric module includes: a first substrate; a first electrode part disposed on the first substrate; a semiconductor element part disposed on the first electrode part; a second electrode part disposed on the semiconductor element part; a second substrate disposed on the second electrode part; and a second terminal electrode and a first terminal electrode arranged in an area on the first substrate in which the first electrode part is not disposed, and the shield member includes a first protruding part protruding toward the first substrate in a corresponding area between the first terminal electrode and the second terminal electrode.

14 Claims, 14 Drawing Sheets

(56) References Cited

U.S. PATENT DOCUMENTS

| | | | | | |
|---|---|---|---|---|---|
| 5,892,656 | A | * | 4/1999 | Bass | H10N 10/17 136/203 |
| 6,056,163 | A | * | 5/2000 | Lai | B65D 83/48 222/321.2 |
| 2003/0057560 | A1 | * | 3/2003 | Tatoh | H10N 10/17 257/773 |
| 2004/0013152 | A1 | * | 1/2004 | Tatoh | H01S 5/02415 372/75 |
| 2006/0027257 | A1 | * | 2/2006 | Yamaguchi | H10N 10/13 136/203 |
| 2006/0219281 | A1 | * | 10/2006 | Kuroyanagi | H10N 10/17 136/204 |
| 2006/0289051 | A1 | * | 12/2006 | Niimi | H10N 10/82 136/203 |
| 2007/0028955 | A1 | * | 2/2007 | Sogou | H05K 1/0204 136/200 |
| 2009/0050808 | A1 | | 2/2009 | Ushimi et al. | |
| 2016/0064638 | A1 | * | 3/2016 | Salvador | H10N 10/01 136/201 |

FOREIGN PATENT DOCUMENTS

| | | |
|---|---|---|
| KR | 10-2021-0156535 | 12/2021 |
| WO | WO 2021/145677 | 7/2021 |

* cited by examiner

SECOND DIRECTION

FIRST DIRECTION

THIRD DIRECTION

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2023/001199, filed Jan. 26, 2023, which claims priority to Korean Patent Application No. 10-2022-0013193, filed Jan. 28, 2022, whose entire disclosures are hereby incorporated by reference.

TECHNICAL FIELD

The present invention relates to a thermoelectric device, and more specifically, to a thermoelectric device using a temperature difference between a low-temperature part and a high-temperature part of a thermoelectric element.

BACKGROUND ART

A thermoelectric phenomenon is a phenomenon caused by the movement of electrons and holes inside a material and means direct energy conversion between heat and electricity.

A thermoelectric element is generally referred to as an element using the thermoelectric phenomenon and has a structure in which P-type thermoelectric materials and N-type thermoelectric materials are bonded between metal electrodes to form pairs of PN junctions.

Thermoelectric elements may be classified into elements using a temperature change according to electrical resistance, elements using a Seebeck effect, which is a phenomenon in which an electromotive force is generated due to a temperature difference, elements using the Peltier effect, which is a phenomenon in which heat absorption or heat radiation occurs according to a current, and the like.

Thermoelectric elements are widely applied to home appliances, electronic components, communication components, and the like. For example, the thermoelectric elements may be applied to cooling devices, heating devices, power generation devices, and the like. Therefore, the demand for improving the thermoelectric performance of the thermoelectric element is gradually increasing.

Recently, there is a need to generate electricity using high-temperature waste heat generated from engines of vehicles, vessels, and the like and the thermoelectric element. In this case, a fluid flow part through which a first fluid passes may be disposed at low-temperature parts of the thermoelectric element, a heat sink may be disposed at high-temperature parts of the thermoelectric element, and a second fluid with a higher temperature than the first fluid may pass through the heat sink. Therefore, electricity may be generated by a temperature difference between the low-temperature parts and the high-temperature parts of the thermoelectric element.

DISCLOSURE

Technical Problem

The technical objects for achieving present invention are directed to providing a thermoelectric device using a temperature difference between low-temperature parts and high-temperature parts of a thermoelectric element.

Technical Solution

A thermoelectric device according to one embodiment of the present invention includes a duct, a first thermoelectric module disposed on the duct and including a thermoelectric element, and a shield member disposed on the first thermoelectric module, wherein the first thermoelectric module includes a first substrate, a first electrode part disposed on the first substrate, a semiconductor element part disposed on the first electrode part, a second electrode part disposed on the semiconductor element part, a second substrate disposed on the second electrode part, and a first terminal electrode and a second terminal electrode that are disposed on an area of the first substrate in which the first electrode part is not disposed, and the shield member includes a first protruding part protruding toward the first substrate from an area corresponding to an area between the first terminal electrode and the second terminal electrode.

The thermoelectric device may include a bonding layer disposed between the second substrate and the first substrate.

A distance between the first substrate and the shield member in a direction perpendicular to the first substrate in an area in which the first electrode part is disposed may be greater than that in the area corresponding to the area between the first terminal electrode and the second terminal electrode.

Polarities of the first terminal electrode and the second terminal electrode may be different from each other.

A height of the bonding layer in a direction perpendicular to the first substrate may be greater than a height of the first terminal electrode or the second terminal electrode.

The thermoelectric device may further include a second thermoelectric module disposed adjacent to the first thermoelectric module and including a third terminal electrode and a fourth terminal electrode, wherein the shield member may be disposed on the second thermoelectric module, and the shield member may include a second protruding part protruding from an area corresponding to an area between the first thermoelectric module and the second thermoelectric module.

The second protruding part may be disposed on an electrical wire connecting the first thermoelectric module with the second thermoelectric module.

The first thermoelectric module may further include a heat sink disposed on the thermoelectric element.

The first thermoelectric module may further include a first connector disposed on the first terminal electrode and a second connector disposed on the second terminal electrode, an inner surface of the shield member may include a first area disposed parallel to the first substrate between the first connector and the second connector, a second area disposed parallel to the first substrate on the first connector and the second connector, and a third area disposed parallel to side surfaces of the first connector and the second connector between the first area and the second area, the first protruding part may include the first area and the third area, and the second area and the third area may be spaced apart from the first connector and the second connector.

An insulating layer may be disposed on the second area and the third area.

The first thermoelectric module may further include a first connector disposed on the first terminal electrode and a second connector disposed on the second terminal electrode, and may further include a first layer disposed on each of the first connector and the second connector and a second layer having a material different from that of the first layer and disposed on the first layer.

The shield member may be made of an insulating material.

A thermoelectric device according to one embodiment of the present invention includes a duct, a first thermoelectric module and a second thermoelectric module disposed on the duct in a first direction, and a shield member disposed on the first thermoelectric module and the second thermoelectric module, wherein each thermoelectric module includes a thermoelectric element and a heat sink, the thermoelectric element includes a first substrate, a first electrode part disposed on the first substrate, a semiconductor element part disposed on the first electrode part, a second electrode part disposed on the semiconductor element part, and a second substrate disposed on the second electrode part, and the heat sink is disposed on the first substrate, the first electrode part includes a plurality of first electrodes disposed in an effective area perpendicularly overlapping the semiconductor element part, the second electrode part, and the second substrate on the first substrate, a first terminal electrode disposed at one side of the effective area on the first substrate, and a second terminal electrode disposed to be spaced apart from the first terminal electrode at the one side of the effective area on the first substrate, the shield member includes a first through hole and a second through hole, the first through hole and the second through hole pass through the heat sink of the first thermoelectric module and the heat sink of the second thermoelectric module, respectively, and edges of the first through hole and the second through hole are disposed on the second substrates of the first thermoelectric module and the second thermoelectric module, respectively, the shield member covers the first terminal electrode and the second terminal electrode of each of the first thermoelectric module and the second thermoelectric module at one side of the effective area on the first substrate of each of the first thermoelectric module and the second thermoelectric module, and a distance between the first substrate and the shield member in an area in which the second terminal electrode of the first thermoelectric module is disposed is greater than a distance between the first substrate and the shield member between the second terminal electrode of the first thermoelectric module and the first terminal electrode of the second thermoelectric module.

The first thermoelectric module and the second thermoelectric module may further include a first connector disposed on the first terminal electrode and a second connector disposed on the second terminal electrode, respectively, the first connector and the second connector may have different polarities, the second connector of the first thermoelectric module and the first connector of the second thermoelectric module may be connected by an electrical wire, and the shield member may be in contact with the electrical wire between the second connector of the first thermoelectric module and the first connector of the second thermoelectric module.

Advantageous Effects

According to an embodiment of the present invention, it is possible to obtain a thermoelectric device that has a simple structure, is easy to assemble, and can accommodate a maximum number of thermoelectric elements in a predetermined space.

According to an embodiment of the present invention, it is possible to obtain a thermoelectric device with high thermoelectric performance by increasing a temperature difference between high-temperature parts and low-temperature parts.

A thermoelectric device according to an embodiment of the present invention can be applied to power generation devices for generating electricity using a temperature difference between high-temperature parts and low-temperature parts.

A thermoelectric device according to an embodiment of the present invention can be applied to a Peltier device for cooling or heating a specific object such as a fluid.

In particular, according to an embodiment of the present invention, it is possible to prevent the occurrence of an electrical short due to condensation near a connector caused by a temperature difference between high-temperature parts and low-temperature parts.

DESCRIPTION OF DRAWINGS

FIGS. 13 to 15 are cross-sectional views of the thermoelectric device according to the embodiment of the present invention.

MODES OF THE INVENTION

Hereinafter, exemplary embodiments according to the present invention will be described in detail with reference to the accompanying drawings.

However, the technical spirit of the present invention is not limited to some embodiments to be described, but may be implemented in various different forms, and one or more of the components among the embodiments may be used by being selectively coupled or substituted without departing from the scope of the technical spirit of the present invention.

In addition, terms (including technical and scientific terms) used in embodiments of the present invention may be construed as meaning that may be generally understood by those skilled in the art to which the present invention pertains unless explicitly specifically defined and described, and the meanings of the commonly used terms, such as terms defined in a dictionary, may be construed in consideration of contextual meanings of related technologies.

In addition, the terms used in the embodiments of the present invention are for describing the embodiments and are not intended to limit the present invention.

In the specification, a singular form may include a plural form unless otherwise specified in the phrase, and when described as "at least one (or one or more) of A, B, and C," one or more among all possible combinations of A, B, and C may be included.

In addition, terms such as first, second, A, B, (a), and (b) may be used to describe components of the embodiments of the present invention.

These terms are only for the purpose of distinguishing one component from another component, and the nature, sequence, order, or the like of the corresponding components is not limited by these terms.

In addition, when a first component is described as being "connected," "coupled," or "joined" to a second component, it may include a case in which the first component is directly connected, coupled, or joined to the second component, but also a case in which the first component is "connected," "coupled," or "joined" to the second component with other components disposed between the first component and the second component.

In addition, when a certain component is described as being formed or disposed on "on (above)" or "below (under)" another component, the terms "on (above)" or "below (under)" may include not only a case in which two components are in direct contact with each other, but also a case in which one or more other components are formed or disposed between the two components. In addition, when described as "on (above) or below (under)," it may include the meaning of not only an upward direction but also a downward direction based on one component.

Figure 1:
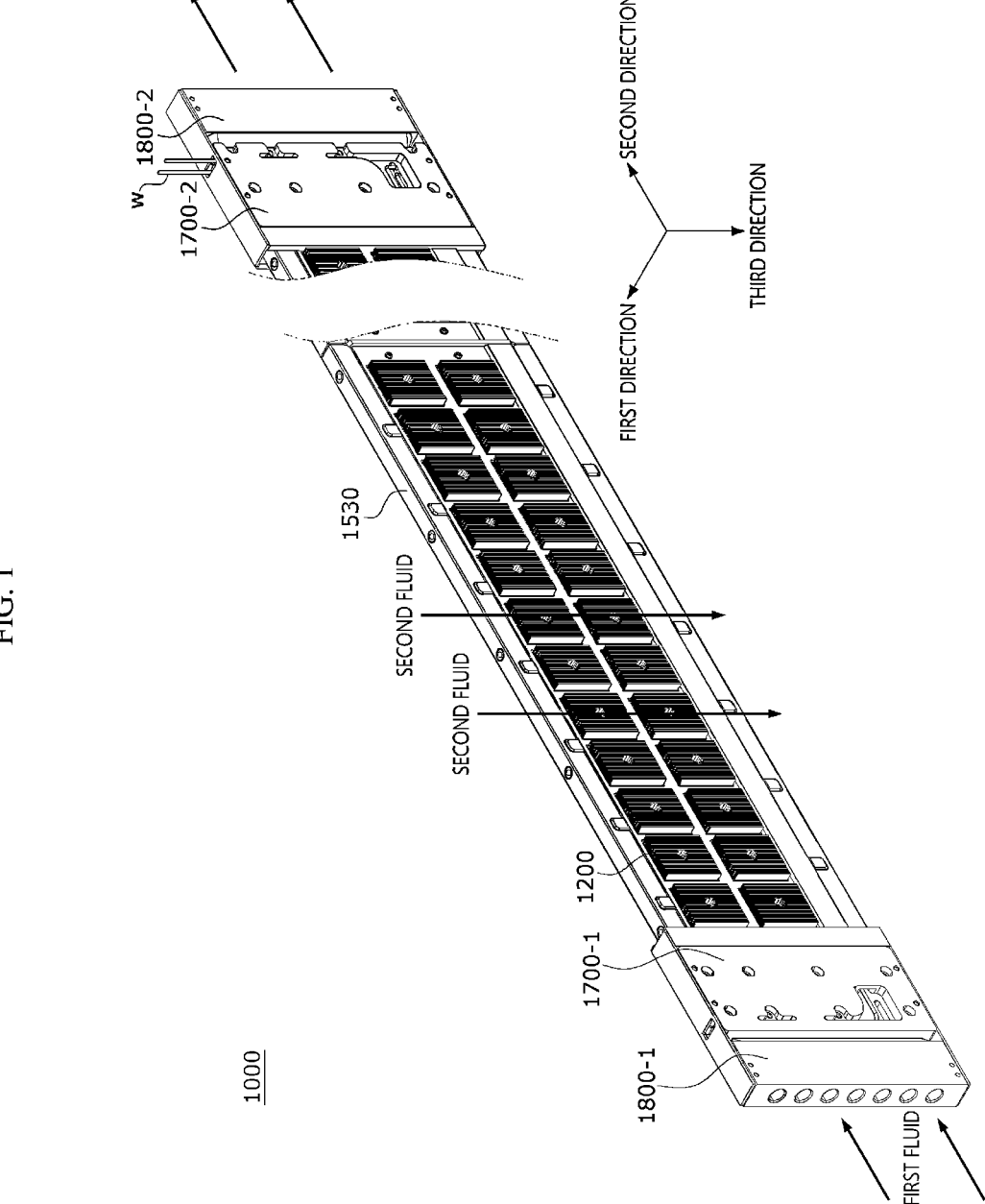
FIG. 1 is a perspective view of a thermoelectric device according to one embodiment of the present invention.
Figure 2:
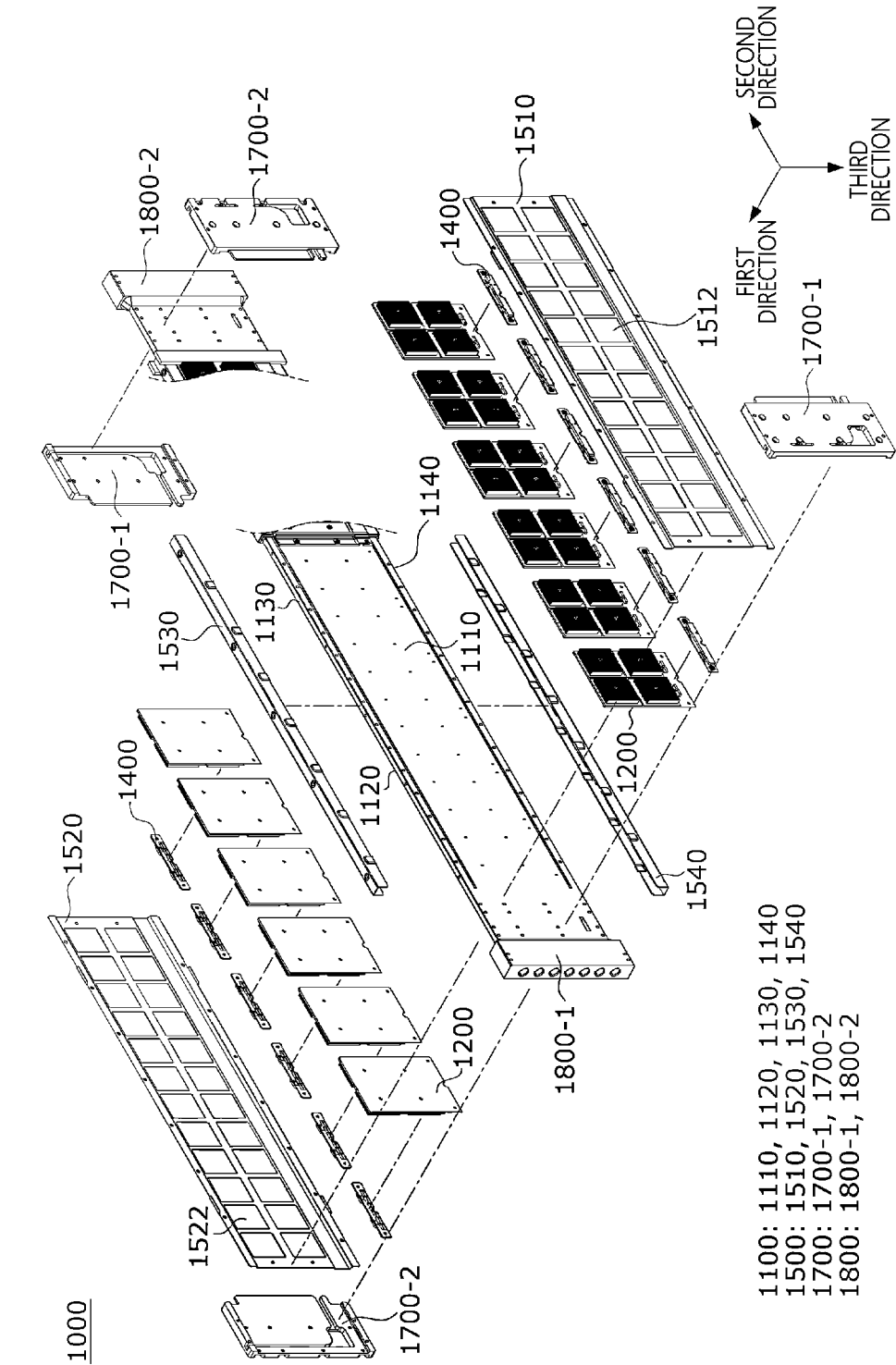
FIG. 2 is an exploded perspective view of the thermoelectric device according to one embodiment of the present invention.

FIG. 1 is a perspective view of a thermoelectric device according to one embodiment of the present invention, and FIG. 2 is an exploded perspective view of the thermoelectric device according to one embodiment of the present invention.

Referring to FIGS. 1 and 2, a thermoelectric device 1000 includes a fluid flow part 1100 and a thermoelectric module 1200 disposed on a surface of the fluid flow part 1100.

The thermoelectric device 1000 according to the embodiment of the present invention may generate power using a temperature difference between a first fluid flowing inside the fluid flow part 1100 and a second fluid flowing outside the fluid flow part 1100. A plurality of thermoelectric devices 1000 may be disposed in parallel to be spaced a predetermined distance from each other to form a power generation system.

The first fluid flowing into the fluid flow part 1100 may be water, but is not limited thereto and may be various types of fluids with cooling performance. A temperature of the first fluid flowing into the fluid flow part 1100 may be lower than 100° C., preferably, lower than 50° C., and more preferably, lower than 40° C., but is not limited thereto and may be a fluid with a lower temperature than the second fluid. A temperature of the first fluid discharged after passing through the fluid flow part 1100 may be higher than the temperature of the first fluid flowing into the fluid flow part 1100.

According to the embodiment of the present invention, a plurality of thermoelectric modules 1200 may be disposed on a first surface 1110 and a second surface 1120 facing the first surface 1110 of the fluid flow part 1100. The first fluid may flow from one side surface between the first surface 1110 and the second surface 1120 toward the other side surface facing the one side surface between the first surface 1110 and the second surface 1120. To this end, a fluid inlet may be disposed on the one side surface, and a fluid outlet may be disposed on the other side surface. The second fluid may flow from a third surface 1130, which is an upper surface between the first surface 1110 and the second surface 1120, toward a fourth surface 1140, which is a lower surface between the first surface 1110 and the second surface 1120. For convenience of description, in the specification, a direction from the first surface 1110 to the second surface 1120 may be referred to as a first direction, a direction in which the first fluid flows may be referred to as a second direction, and a direction in which the second fluid flows may be referred to as a third direction, but the present invention is not limited thereto.

In order to facilitate the introduction and discharge of the first fluid and support the fluid flow part 1100, a first connecting member 1800-1 and a second connecting member 1800-2 may be installed at the fluid inlet and the fluid outlet of the fluid flow part 1100, respectively. In the specification, the first connecting member 1800-1 and the second connecting member 1800-2 may be used interchangeably with a first tube expanding member 1800-1 and a second tube expanding member 1800-2, respectively. Alternatively, in the specification, the first connecting member 1800-1 and the second connecting member 1800-2 may be used interchangeably with a first tube expanding block 1800-1 and a second tube expanding block 1800-2, respectively.

Meanwhile, the second fluid passes through the outside of the thermoelectric module 1200, for example, a heat sink disposed outside the fluid flow part 1100. The second fluid may be a waste heat fluid generated from engines of a vehicle, a vessel, etc., but is not limited thereto. For example, a temperature of the second fluid may be 100° C. or higher, preferably, 200° C. or higher, and more preferably, 220 to 250° C., but is not limited thereto and may be a fluid with a higher temperature than the first fluid.

In the specification, an example in which a temperature of the first fluid flowing through the inside of the fluid flow part 1100 is lower than the temperature of the second fluid passing through the heat sink of the thermoelectric module 1200 disposed outside the fluid flow part 1100 will be described. Therefore, in the specification, the fluid flow part 1100 may be referred to as a duct or a cooling part. However, the embodiment of the present invention is not limited thereto, and the temperature of the first fluid flowing through the inside of the fluid flow part 1100 may be higher than the temperature of the second fluid passing through the heat sink of the thermoelectric module 1200 disposed outside the fluid flow part 1100.

According to the embodiment of the present invention, the thermoelectric module 1200 includes a thermoelectric element and the heat sink disposed on the thermoelectric element. The thermoelectric element according to the embodiment of the present invention may have a structure of a thermoelectric element 100 illustrated in FIGS. 3 and 4.

Figure 3:
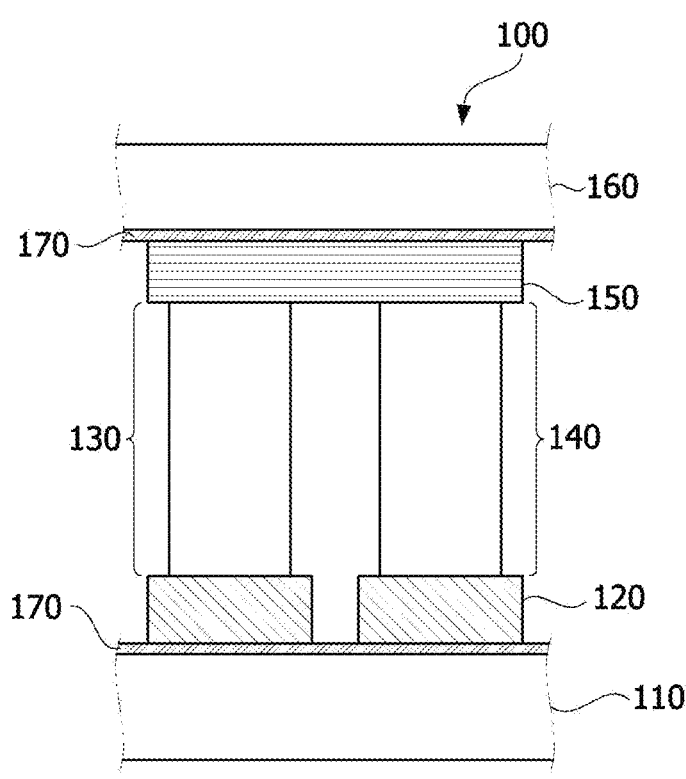
FIG. 3 is a cross-sectional view of a thermoelectric element according to one embodiment of the present invention.
Figure 4:
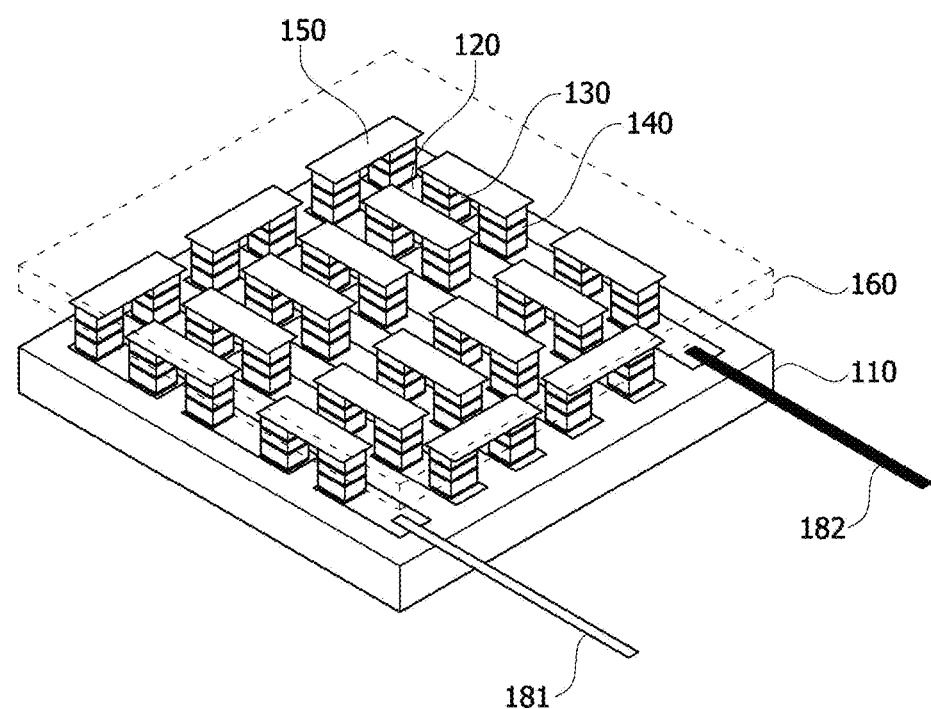
FIG. 4 is a perspective view of the thermoelectric element according to one embodiment of the present invention.

Referring to FIGS. 3 and 4, the thermoelectric element 100 includes a first substrate 110, a first electrode 120, a P-type thermoelectric leg 130, an N-type thermoelectric leg 140, a second electrode 150, and a second substrate 160.

The first electrode 120 is disposed between the first substrate 110 and lower bottom surfaces of the P-type thermoelectric leg 130 and the N-type thermoelectric leg 140, and the second electrode 150 is disposed between a bottom surface of the second substrate 160 and upper surfaces of the P-type thermoelectric leg 130 and the N-type thermoelectric leg 140. Therefore, the plurality of P-type thermoelectric legs 130 and the plurality of N-type thermoelectric legs 140 are electrically connected by the first electrodes 120 and the second electrodes 150. A pair of P-type thermoelectric leg 130 and N-type thermoelectric leg 140 disposed between the first electrodes 120 and the second electrode 150 and electrically connected may form a unit cell.

For example, when a voltage is applied to the first electrode 120 and the second electrode 150 through lead wires 181 and 182, due to the Peltier effect, a substrate in which a current flows from the P-type thermoelectric leg 130 to the N-type thermoelectric leg 140 may absorb heat to function as a cooling part, and a substrate in which a current flows from the N-type thermoelectric leg 140 to the P-type thermoelectric leg 130 may be heated to function as a heating part. Alternatively, when the temperature difference between the first electrode 120 and the second electrode 150 is applied, charges in the P-type thermoelectric leg 130 and the N-type thermoelectric leg 140 may be moved due to the Seebeck effect to generate electricity.

Here, the P-type thermoelectric leg 130 and the N-type thermoelectric leg 140 may be bismuth telluride (Bi—Te)-based thermoelectric legs containing bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %. The N-type thermoelectric leg 140 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Se—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %.

The P-type thermoelectric leg 130 and the N-type thermoelectric leg 140 may be formed in a bulk type or stack type. In general, the bulk-type P-type thermoelectric leg 130 or the bulk-type N-type thermoelectric leg 140 may be obtained through a process of manufacturing an ingot through thermal treatment for a thermoelectric material, crushing and sieving the ingot to acquire powder for the thermoelectric leg, then sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may increase. The stack-type P-type thermoelectric leg 130 or the stack-type N-type thermoelectric leg 140 may be obtained through a process of coating a sheet-shaped base with a paste containing a thermoelectric material to form a unit member, and then stacking and cutting the unit members.

In this case, the pair of P-type thermoelectric legs 130 and N-type thermoelectric legs 140 may have the same shape and volume or have different shapes and volumes. For example, since the electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, or the like.

In the specification, the thermoelectric leg may be referred to as a thermoelectric structure, a semiconductor element, a semiconductor structure, or the like.

The performance of the thermoelectric element according to one embodiment of the present invention may be expressed as a thermoelectric figure of merit (ZT). The ZT can be expressed as in Equation 1.

$$ZT = \alpha^2 \cdot \sigma \cdot T/k \qquad \text{[Equation 1]}$$

Here, $\alpha$ denotes a Seebeck coefficient [V/K], $\sigma$ denotes an electrical conductivity [S/m], and $\alpha^2\sigma$ denotes a power factor [W/mK$^2$]. In addition, T denotes a temperature, and k denotes a thermal conductivity [W/mK]. k can be expressed as a·cp·ρ, in which a denotes a thermal diffusivity [cm2/S], cp denotes a specific heat [J/gK], and ρ denotes a density [g/cm$^3$].

In order to obtain a thermoelectric performance index of the thermoelectric element, a Z value (V/K) may be measured using a Z meter, and the ZT may be calculated using the measured Z value.

Here, the first electrode 120 disposed between the first substrate 110 and the P-type thermoelectric leg 130 and the N-type thermoelectric leg 140, and the second electrode 150 disposed between the second substrate 160 and the P-type thermoelectric leg 130 and the N-type thermoelectric leg 140 may contain at least one of copper (Cu), silver (Ag), aluminum (Al), and nickel (Ni) and have a thickness of 0.01 to 0.3 mm. When a thickness of the first electrode 120 or the second electrode 150 is smaller than 0.01 mm, a function as an electrode may be degraded, thereby reducing the electrical conduction performance, and when the thickness exceeds 0.3 mm, the electrical conduction efficiency can be reduced due to an increase in resistance.

In addition, the first substrate 110 and the second substrate 160 facing each other may be metal substrates, and thicknesses thereof may be in a range of 0.1 to 1.5 mm. When the thickness of the metal substrate is smaller than 0.1 mm or more than 1.5 mm, the heat radiation characteristics or thermal conductivity may be excessively high, thereby reducing the reliability of the thermoelectric element. In addition, when the first substrate 110 and the second substrate 160 are metal substrates, an insulating layer 170 may be further formed between the first substrate 110 and the first electrode 120 and between the second substrate 160 and the second electrode 150. The insulating layer 170 may include a material with a thermal conductivity of 1 to 20 W/mK. In this case, the insulating layer 170 may be a layer made of a resin composition containing at least one of an epoxy resin and silicone resin and an inorganic material or a silicone composite containing silicone and an inorganic material. Here, the inorganic material may be at least one of an oxide, a nitride, and carbide of aluminum, boron, and silicon.

In this case, the first substrate 110 and the second substrate 160 may be formed to have different sizes. In other words, a volume, thickness, or area of one of the first substrate 110 and the second substrate 160 may be formed to be greater than a volume, thickness, or area of the other one. Here, the thickness may be a thickness in a direction from the first substrate 110 to the second substrate 160, and the area may be an area in a direction perpendicular to a direction from the first substrate 110 to the second substrate 160. Therefore, it is possible to enhance the heat absorption or heat radiation performance of the thermoelectric element. Preferably, the volume, thickness, or area of the first substrate 110 may be formed to be greater than at least one of the volume, thickness, or area of the second substrate 160. In this case, when the first substrate 110 is disposed on a high-temperature area for the Seebeck effect, when the first substrate 110 is applied as a heating area for the Peltier effect, or when a sealing member for protecting the first substrate 110 from an external environment of the thermoelectric element, which will be described below, is disposed on the first substrate 110, at least one of the volume, the thickness, and the area of the first substrate may become greater than the second substrate 160. In this case, the area of the first substrate 110 may be in a range of 1.2 to 5 times the area of the second substrate 160. When the area of the first substrate 110 is formed to be smaller than 1.2 times that of the second substrate 160, the influence on improving thermal transfer efficiency is not high, and when the area of the first substrate 110 exceeds 5 times, the thermal transfer efficiency may be rather reduced significantly, thereby making it difficult to maintain a basic shape of the thermoelectric module.

In addition, a heat radiation pattern, for example, an uneven pattern may be formed on a surface of at least one of the first substrate 110 and the second substrate 160. Therefore, it is possible to enhance the heat radiation performance of the thermoelectric element. When the uneven pattern is formed on the surface in contact with the P-type thermoelectric leg 130 or the N-type thermoelectric leg 140, it is possible to improve the bonding characteristics between the thermoelectric leg and the substrate.

Although not illustrated, a sealing member may be further disposed between the first substrate 110 and the second substrate 160. The sealing member may be disposed on side surfaces of the first electrode 120, the P-type thermoelectric leg 130, the N-type thermoelectric leg 140, and the second electrode 150 between the first substrate 110 and the second substrate 160. Therefore, the first electrode 120, the P-type thermoelectric leg 130, the N-type thermoelectric leg 140, and the second electrode 150 may be shielded from external moisture, heat, contaminants, and the like.

Referring back to FIGS. 1 and 2, the plurality of thermoelectric modules 1200 may be disposed on the first surface 1110 and the second surface 1120 of the fluid flow part 1100.

As described above, each thermoelectric element includes the first substrate 110 disposed in contact with the fluid flow part 1100, the plurality of first electrodes 120 disposed on the first substrate 110, the plurality of thermoelectric legs 130 and 140 disposed on the plurality of first electrodes 120, the plurality of second electrodes 150 disposed on the plurality of thermoelectric legs 130 and 140, and the plurality of second electrodes 150, and the heat sink is disposed on the second substrate 160. In this case, the first substrate of the thermoelectric element disposed on the fluid flow part 1100 may be a metal substrate, and the metal substrate may be attached to the surface of the fluid flow part 1100 by a thermal interface material (TIM) (not illustrated). Since the metal substrate has excellent thermal transfer performance, thermal transfer between the thermoelectric element and the fluid flow part 1100 is easy. In addition, when the metal substrate and the fluid flow part 1100 are bonded by the TIM, the thermal transfer between the metal substrate and the fluid flow part 1100 may not be hindered. Here, the metal substrate may be one of a copper substrate, an aluminum substrate, and a copper-aluminum substrate, but is not limited thereto.

Each of the plurality of thermoelectric modules 1200 may include a connector for extracting generated electricity to the outside or applying the electricity to be used as a Peltier device. According to the embodiment of the present invention, a support member 1400 may be disposed near the connector to uniformly maintain a bonding strength between the thermoelectric module 1200 and the fluid flow part 1100 and protect an electrical wire connected to the connector.

In addition, according to the embodiment of the present invention, a shield member 1500 may be further disposed to prevent moisture or contaminants from flowing into the plurality of thermoelectric modules 1200. The shield member 1500 may include a first shield member 1510 disposed on the first surface 1110 of the fluid flow part 1100 and a second shield member 1520 disposed on the second surface 1120 of the fluid flow part 1100. The first shield member 1510 and the second shield member 1520 may each be disposed on the second substrate of the thermoelectric element. In this case, in order for the second fluid to pass through the heat sink, through holes 1512 and 1522 may be formed in the first shield member 1510 and the second shield member 1520, respectively, and edges of the through holes 1512 and 1522 may be disposed on the second substrate of the thermoelectric element so that the heat sink may be exposed through the through holes 1512 and 1522. Therefore, it is possible to protect the inside of the thermoelectric element from external contaminants, moisture, and the second fluid and allow the second fluid to directly pass through the heat sink, thereby efficiently performing the heat exchange between the second fluid and the heat sink. According to one embodiment of the present invention, the shield member 1500 may further include a third shield member 1530 disposed on the third surface 1130 of the fluid flow part 1100 and a fourth shield member 1540 disposed at the fourth surface 1140 of the fluid flow part 1100. Since the second fluid may flow in a direction from the third surface 1130 to the fourth surface 1140 of the fluid flow part 1100, an insulating member may be further disposed between the third surface 1130 of the fluid flow part 1100 and the third shield member 1530 and between the fourth surface 1140 and the fourth shield member 1540. Therefore, since the first fluid flowing inside the fluid flow part 1100 and the second fluid flowing outside the fluid flow part 1100 are insulated, it is possible to enhance the thermoelectric performance of the thermoelectric element.

Meanwhile, according to the embodiment of the present invention, a guide member 1700 may be further disposed on the first surface 1110 and the second surface 1120 of the fluid flow part 1100. The guide member 1700 may function to guide an electrical wire connected to the thermoelectric module 1200 to the outside. The guide member 1700 may be disposed on a side surface of the thermoelectric module 1200 on each of the first surface 1110 and the second surface 1120 of the fluid flow part 1100.

Figure 5:
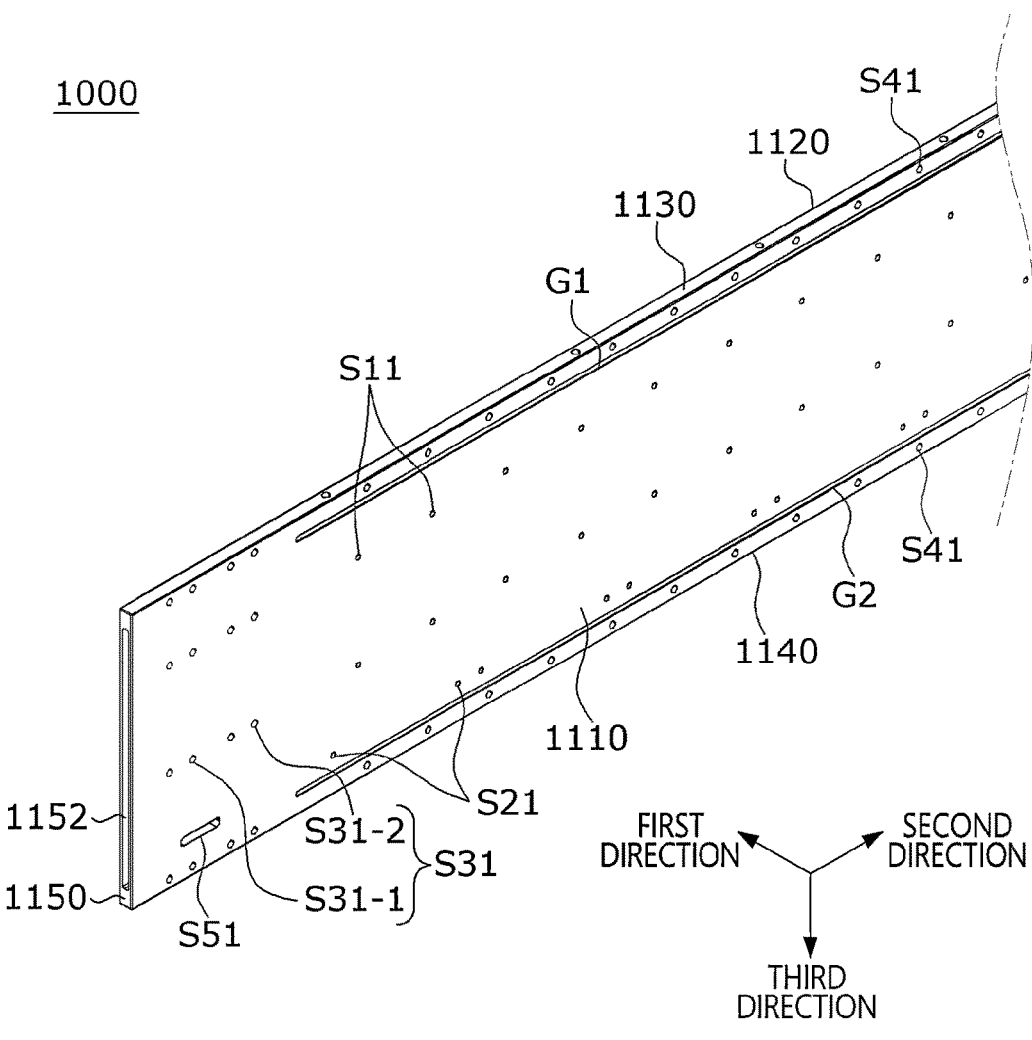
FIG. 5 is a perspective view of one surface of a fluid flow part included in the thermoelectric device according to one embodiment of the present invention.
Figure 6:
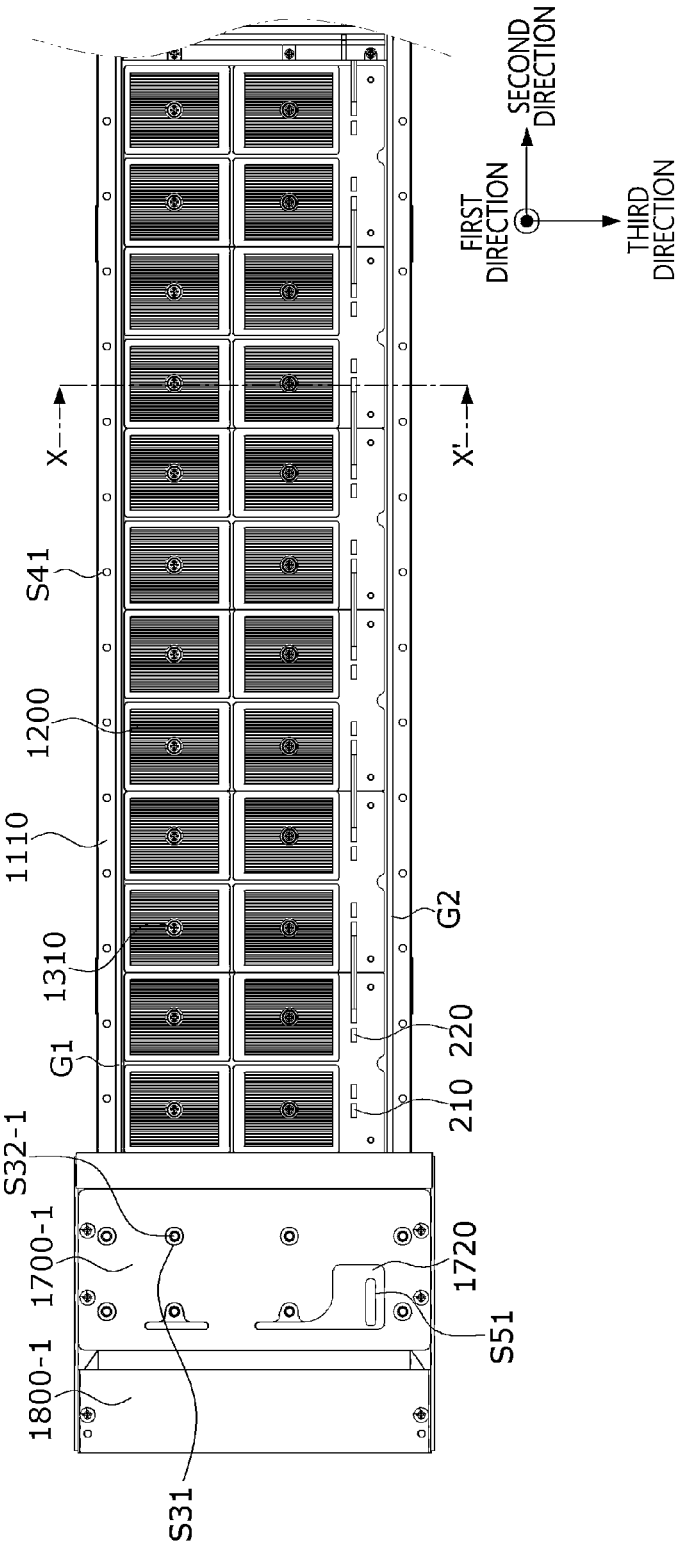
FIG. 6 is a top view of a plurality of thermoelectric modules and a guide member disposed on the one surface of the fluid flow part included in the thermoelectric device according to one embodiment of the present invention.
Figure 7:
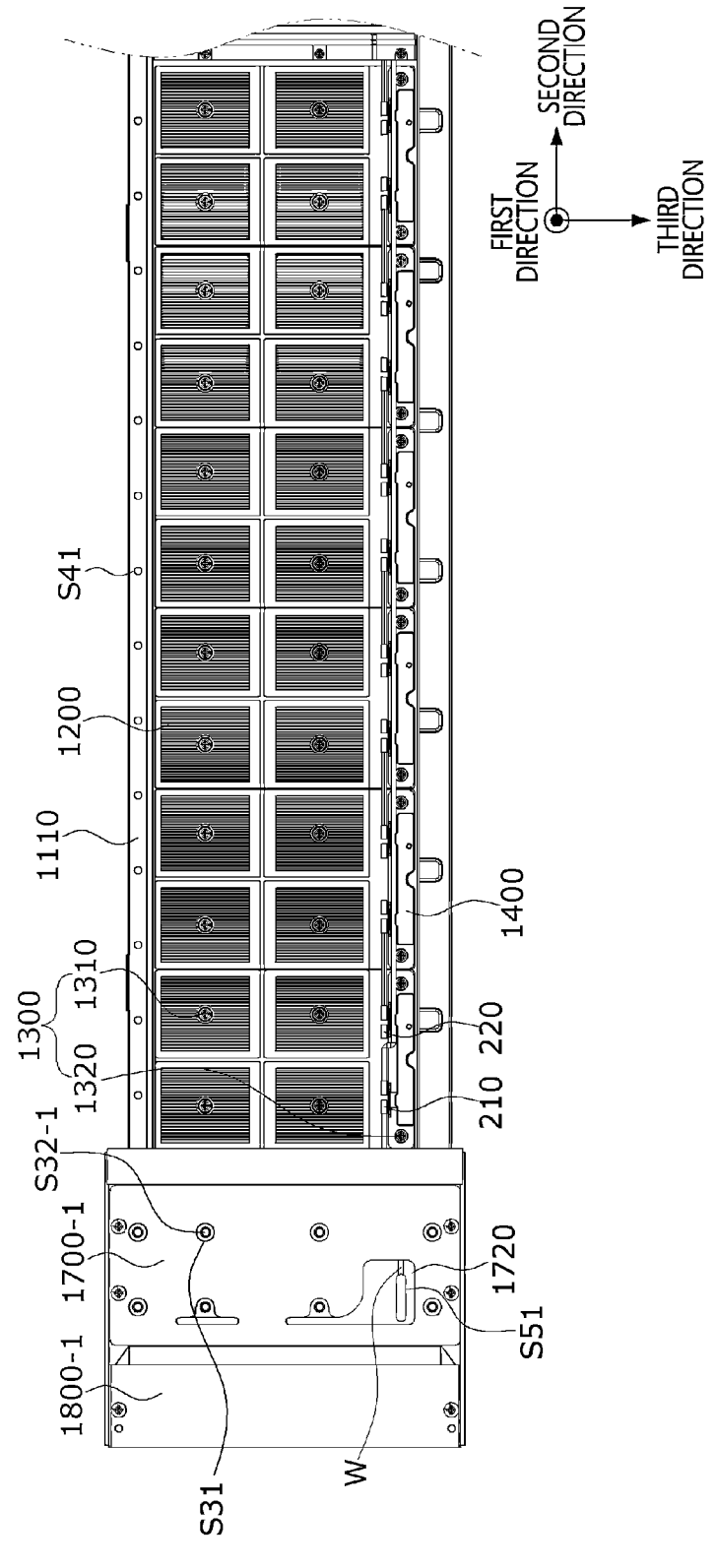
FIG. 7 is a top view of the plurality of thermoelectric modules, the guide member, and a plurality of support members disposed on the one surface of the fluid flow part included in the thermoelectric device according to one embodiment of the present invention.
Figure 8:
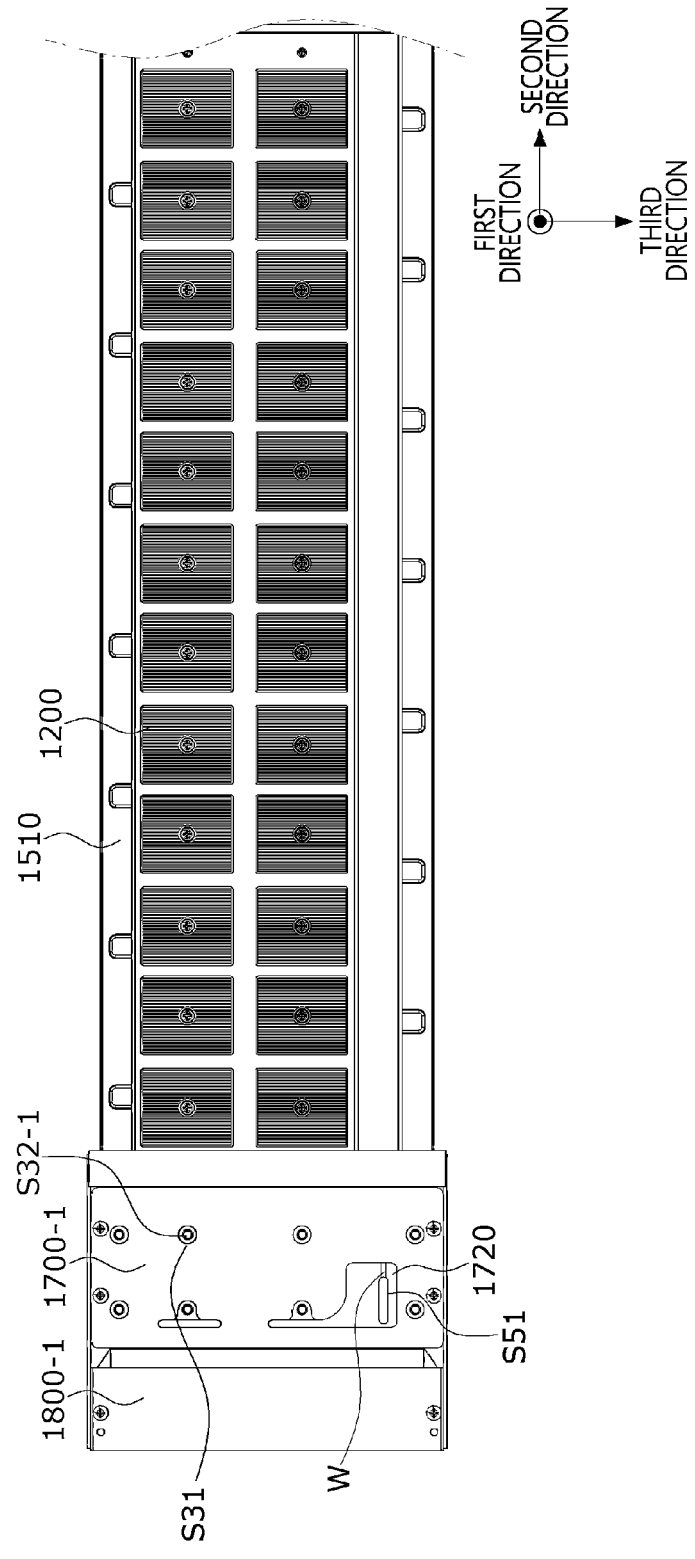
FIG. 8 is a top view of the plurality of thermoelectric modules, the guide member, the plurality of support members, and a shield member disposed on the one surface of the fluid flow part included in the thermoelectric device according to one embodiment of the present invention.
Figure 9:
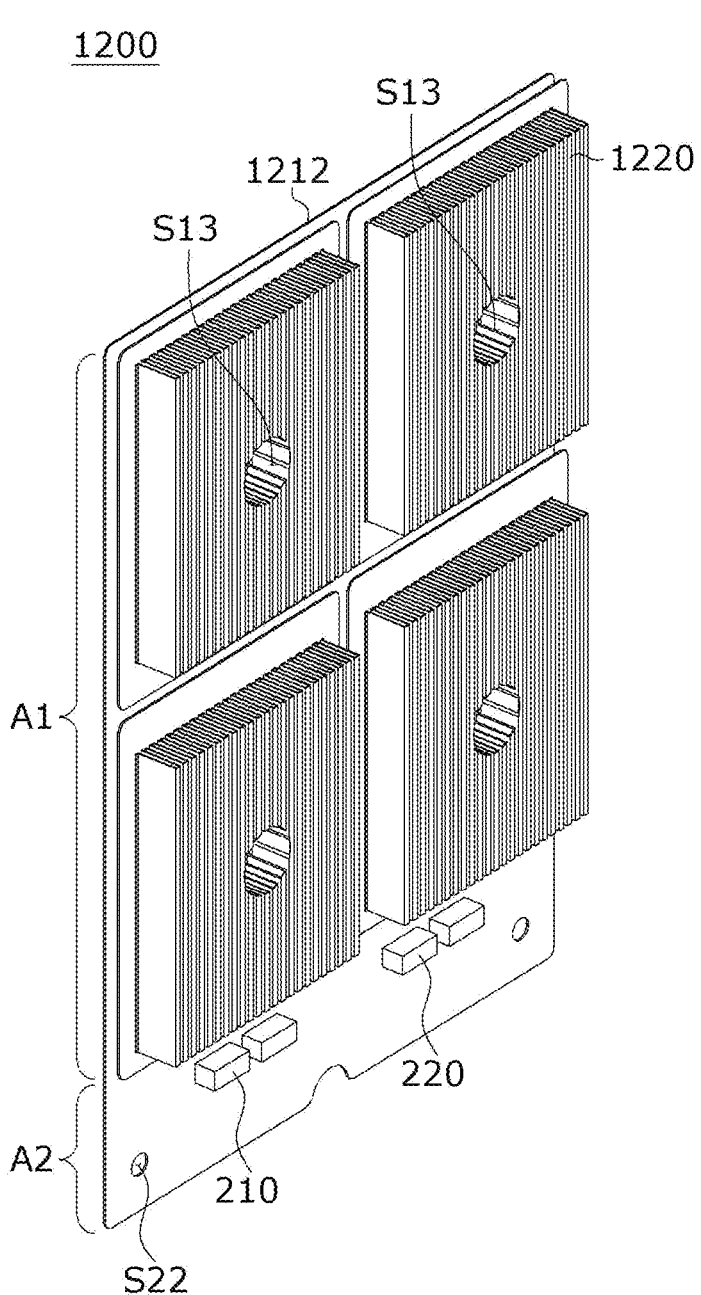
FIG. 9 is a perspective view of the thermoelectric module included in the thermoelectric device according to one embodiment of the present invention.
Figure 10:
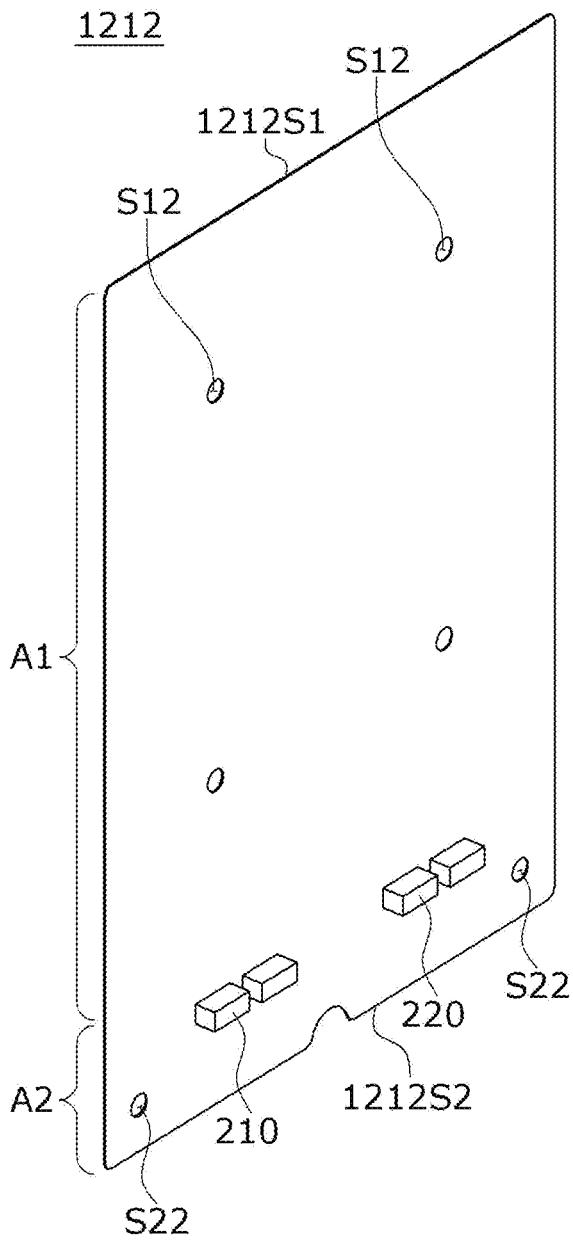
FIG. 10 is a top view of a first substrate of the thermoelectric module included in the thermoelectric device according to one embodiment of the present invention.

FIG. 5 is a perspective view of one surface of a fluid flow part included in the thermoelectric device according to one embodiment of the present invention, FIG. 6 is a top view of a plurality of thermoelectric modules and a guide member disposed on the one surface of the fluid flow part included in the thermoelectric device according to one embodiment of the present invention, FIG. 7 is a top view of the plurality of thermoelectric modules, the guide member, and a plurality of support members disposed on the one surface of the fluid flow part included in the thermoelectric device according to one embodiment of the present invention, FIG. 8 is a top view of the plurality of thermoelectric modules, the guide member, the plurality of support members, and a shield member disposed on the one surface of the fluid flow part included in the thermoelectric device according to one embodiment of the present invention, FIG. 9 is a perspective view of the thermoelectric module included in the thermoelectric device according to one embodiment of the present invention, and FIG. 10 is a top view of a first substrate of the thermoelectric module included in the thermoelectric device according to one embodiment of the present invention.

Referring to FIGS. 5 to 10, the thermoelectric module 1200 and a guide member 1700-1 are disposed on the first surface 1100 of the fluid flow part 1100. Hereinafter, for convenience of description, only the thermoelectric module 1200 and the guide member 1700-1 disposed on the first surface 1110 of the fluid flow part 1100 are described, but the present invention is not limited thereto, and the same structure may be applied to the second surface 1120, which is a surface opposite to the first surface 1110. With regard to the fluid flow part 1100 and the thermoelectric module 1200, overlapping descriptions of the same contents as those described with reference to FIGS. 1 to 4 will be omitted.

According to the embodiment of the present invention, a first substrate 1212 of the thermoelectric module 1200 is disposed on the first surface 1110 of the fluid flow part 1100. In this case, the first substrate 1212 may be disposed in direct contact with the first surface 1110 of the fluid flow part 1100 or disposed in indirect contact therewith through the TIM or the like. The first substrate 1212 may be the first substrate 110 described with reference to FIGS. 1 to 4. Therefore, with regard to the first substrate 1212, overlapping descriptions of the same contents as the first substrate 110 described with reference to FIGS. 1 to 4 will be omitted.

As illustrated in FIGS. 9 and 10, the first substrate 1212 of the thermoelectric module 1200 may include a first area A1 and a second area A2. In this case, a plurality of first electrodes, a plurality of thermoelectric legs, a plurality of second electrodes, a second substrate, and a heat sink 1220 may be disposed on the first area A1, and connectors 210 and 220 connected to the first electrode may be disposed on the second area A2, which is one side of the first area A1. Here, the plurality of first electrodes, the plurality of thermoelectric legs, the plurality of second electrodes, and the second substrate may be the plurality of first electrodes 120, the plurality of thermoelectric legs 130 and 140, the plurality of second electrodes 150, and the second substrate 160 described with reference to FIGS. 1 to 4. In the present specification, the first area A1 is an area in which the plurality of first electrodes, the plurality of thermoelectric legs, the plurality of second electrodes, the second substrate, and the heat sink overlap vertically and may be referred to as an effective area. In the present specification, the second area A2 may be referred to as an area disposed at one side of the effective area. In FIG. 9, an example in which the second substrate and the heat sink 1220 are divided into four portions is illustrated, but the present invention is not limited thereto. One second substrate and one heat sink 1220 may be disposed on one first substrate, or the second substrate and the heat sink 1220 may be disposed by being divided into two or more parts.

According to the embodiment of the present invention, as illustrated in FIGS. 6 to 8, the fluid flow part 1100 and the thermoelectric module 1200 may be coupled by a coupling member 1300. To this end, a first groove S11 formed to overlap the first substrate 1212 of the thermoelectric module 1200 in the first direction, that is, a direction from the first surface 1110 to the second surface 1120 may be formed in the first surface 1110 of the fluid flow part 1100 (see FIG. 5), and a through hole S12 corresponding to the first groove S11 may be formed in the first area A1 of the first substrate 1212 of the thermoelectric module 1200. In addition, a through hole S13 corresponding to the first groove S11 and the through hole S12 may also be formed in the second substrate (not illustrated) and the heat sink 1220 of the thermoelectric module 1200. Therefore, as illustrated in FIGS. 6 to 8, a first coupling member 1310 is coupled to the first groove S11, the through hole S12, and the through hole S13, and thus the fluid flow part 1100 and the thermoelectric module 1200 may be coupled.

Meanwhile, according to the embodiment of the present invention, a second groove S21 may be further formed in the first surface 1110 of the fluid flow part 1100 (see FIG. 5), and a through hole S22 corresponding to the second groove S21 may be further formed in the second area A2 of the first substrate 1212 of the thermoelectric module 1200. In addition, a support member 1400 may be further disposed on the second area A2 of the first substrate 1212, and as illustrated in FIG. 7, the support member 1400 may be connected to the second groove S21 and the through hole S22 through a second coupling member 1320, and thus the fluid flow part 1100, the thermoelectric module 1200, and the support member 1400 may be fixed.

Therefore, since not only the first area A1 but also the second area A2 of the first substrate 1212 of the thermoelectric module 1200 may be coupled to the fluid flow part 1100, the entirety of the first substrate 1212 of the thermoelectric module 1200 may have uniform bonding strength with the fluid flow part 1100, and heat may be uniformly distributed to the entirety of the first substrate 1212. In particular, as illustrated in FIG. 7, when the first substrate 1212 of the thermoelectric module 1200 and the fluid flow part 1100 are coupled using the support member 1400, it is possible to increase a fastening torque of the second coupling member 1320 due to the application of the support member 1400. Therefore, since there is a low possibility that the second coupling member 1320 becomes loose even under a vibration condition, the thermoelectric module 1200 may be more firmly attached to the fluid flow part 1100.

Meanwhile, referring to FIG. 5, the fluid flow part 1100 may have a fluid inlet 1152 of the fluid flow part 1100 disposed on one side surface 1150 between the first surface 1110 and the second surface 1120 and a fluid outlet of the fluid flow part 1100 disposed on the other side surface between the first surface 1110 and the second surface 1120.

In addition, referring to FIGS. 5 to 8, according to the embodiment of the present invention, holes S31 and S41 may be formed in the first surface 1110 of the fluid flow part 1100 so as not to overlap the thermoelectric module 1200. The holes S31 and S41 may be formed to pass through the fluid flow part 1100 from the first surface 1110 to the second surface 1120 of the fluid flow part 1100. For example, the hole S31 may be a hole through which the guide member 1700-1 is fastened, and the hole S41 may be a hole through which the shield member 1500 is fastened. According to the embodiment of the present invention, the TIM may be disposed between the fluid flow part 1100 and the thermoelectric module 1200 in order to maximize the thermal transfer performance between the fluid flow part 1100 and the thermoelectric module 1200. In contrast, the guide member 1700-1 or the shield member 1500 may be disposed on the fluid flow part 1100 without the TIM and then fastened using the coupling member. Therefore, the holes S31 and S41 through which the guide member 1700-1 or the shield member 1500 is fastened may be formed to pass through the first surface 1110 and the second surface 1120 of the fluid flow part 1100.

According to the embodiment of the present invention, a hole S51 may be further formed in the first surface 1110 of the fluid flow part 1100 so as not to overlap the thermoelectric module 1200. The hole S51 may be formed to pass through the fluid flow part 1100 from the first surface 1110 to the second surface 1120 of the fluid flow part 1100 and may be a hole through which the electrical wire connected to the thermoelectric module 1200 passes. To this end, the hole S51 may have a greater area than the other holes S31 and S41, and the hole S51 may be disposed in an area parallel to the second area A2 of the second substrate 1212 of the thermoelectric module 1200. Therefore, the electrical wires connected to the connectors 210 and 220 and supported by the support member 1400 may be disposed to extend to the hole S51, and the electrical wire electrically connected to the thermoelectric module 1200 of the first surface 1100 may be electrically connected to the thermoelectric module 1200 of the second surface 1120 by passing through the hole S51.

According to the embodiment of the present invention, the hole S51 may be symmetrically disposed on the one side surface 1150 and the other side surface side of the fluid flow part 1100, and an electrical wire W may pass through the hole S51 at the one side surface 1150 and the hole S51 at the other side surface side.

Meanwhile, referring to FIGS. 1, 2, and 6 to 9, the thermoelectric device 1000 includes the fluid flow part 1100 and the thermoelectric module 1200 disposed on the surface of the fluid flow part 1100. The thermoelectric module 1200 may include a thermoelectric element 1210 and the heat sink 1220 disposed on the thermoelectric element 1210. According to the embodiment of the present invention, the guide member 1700 may be disposed on the side surfaces of the plurality of thermoelectric modules 1200. When a direction in which the plurality of thermoelectric modules 1200 are disposed is referred to as a second direction, the guide member 1700 may be disposed in the second direction with respect to the plurality of thermoelectric modules 1200.

For example, a pair of guide members 1700-1 and 1700-2 may be disposed to face each other at one side of the first surface 1110 and the second surface 1120 of the fluid flow part 1100. In addition, the pair of guide members 1700-1 and 1700-2 may also be disposed to face each other at the other sides of the first surface 1110 and the second surface 1120 of the fluid flow part 1100.

For example, the first fluid may flow into the one side of the first surface 1110 and the second surface 1120 of the fluid flow part 1100, and the first fluid may be discharged from the other sides of the first surface 1110 and the second surface 1120 of the fluid flow part 1100.

When the first guide member 1700-1 is disposed on the side surface of the thermoelectric module 1200 at the one side of the first surface 1110 of the fluid flow part 1100, the second guide member 1700-2 may be disposed to face the first guide member 1700-1 on the side surface of the thermoelectric module 1200 with the fluid flow part 1100 interposed therebetween at the one side of the second surface 1120 of the fluid flow part 1100. Likewise, when the second guide member 1700-2 is disposed on the side surface of the thermoelectric module 1200 at the other side of the first surface 1110 of the fluid flow part 1100, the first guide member 1700-1 may be disposed to face the second guide member 1700-2 on the side surface of the thermoelectric module 1200 with the fluid flow part 1100 interposed therebetween at the other side of the second surface 1120 of the fluid flow part 1100.

According to the embodiment of the present invention, the guide member 1700 is disposed on the side surface of the thermoelectric module 1200 to reduce an empty space and guide the electrical wire connected to the thermoelectric module 1200. Here, the guide member 1700 may be a structure that does not function as the thermoelectric element. Therefore, in the specification, the guide member may be referred to as a dummy module, a dummy member, or a guide module. Therefore, it is possible to minimize the empty space in the side surface of the thermoelectric module 1200 on the fluid flow part 1100, thereby reducing the possibility of moisture or the second fluid flowing into the empty space.

Meanwhile, referring to FIG. 7, the support member 1400 may be disposed adjacent to the connectors 210 and 220 on the first substrate 1212 of the thermoelectric module 1200, and the electrical wires W connected to the connectors 210 and 220 may extend to the guide member 1700-1 in the second direction through the support member 1400. Therefore, the support member 1400 may uniformly maintain the bonding strength between the thermoelectric module 1200 and the fluid flow part 1100 and protect the electrical wires connected to the connectors 210 and 220.

Figure 11:
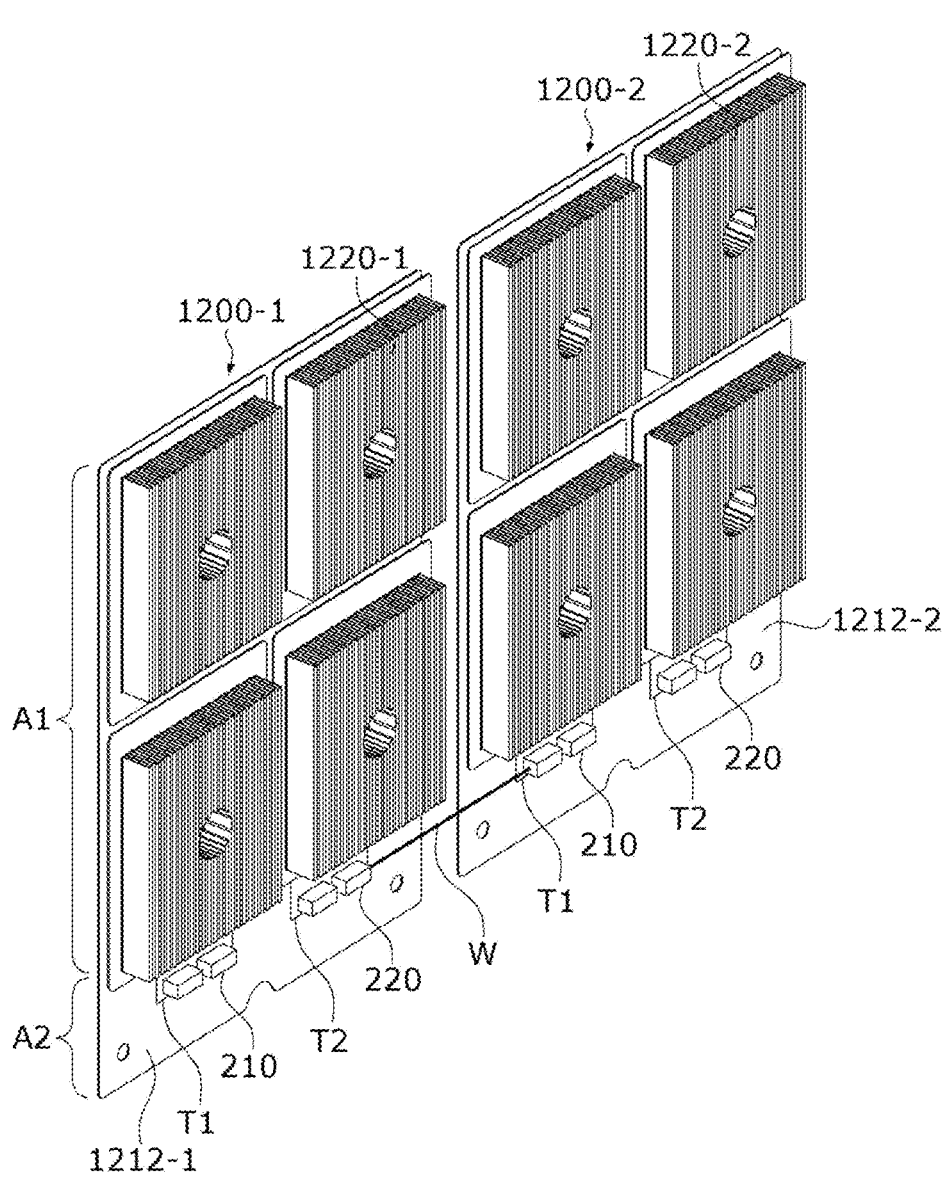
FIG. 11 shows two thermoelectric modules disposed adjacent to each other on the one surface of the fluid flow part according to the embodiment of the present invention.
Figure 12:
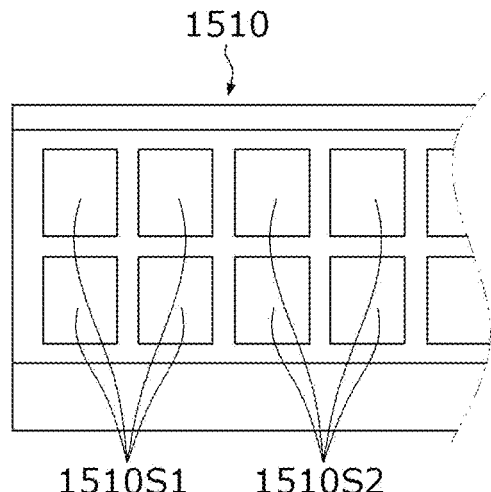
FIG. 12 shows a shield member disposed on the two thermoelectric modules of FIG. 11.

FIG. 11 shows two thermoelectric modules disposed adjacent to each other on the one surface of the fluid flow part according to the embodiment of the present invention, and FIG. 12 shows a shield member disposed on the two thermoelectric modules of FIG. 11.

Referring to FIGS. 11 and 12, a first thermoelectric module 1200-1 and a second thermoelectric module 1200-2 are disposed on the fluid flow part (not shown), and the shield member 1510 is disposed on the first thermoelectric module 1200-1 and the second thermoelectric module 1200-2. The shape of the shield member 1510 disposed on the first thermoelectric module 1200-1 and the second thermoelectric module 1200-2 is as shown in FIG. 8.

As described above, the first thermoelectric module 1200-1 and the second thermoelectric module 1200-2 include a first heat sink 1220-1 and a second heat sink 1220-2, respectively.

The shield member 1510 includes a first through hole 1510S1 and a second through hole 1510S2, the first heat sink 1220-1 of the first thermoelectric module 1200-1 and the second heat sink 1220-2 of the second thermoelectric module 1200-2 are disposed to pass through the first through hole 1510S1 and the second through hole 1510S2, respectively, and edges of the first through hole 1510S1 and the second through hole 1510S2 are each disposed on the second substrates of the first thermoelectric module 1200-1 and the second thermoelectric module 1200-2.

Here, since the thermoelectric module exemplifies a second substrate and a heat sink that are divided into four parts disposed on one first substrate, the first through hole 1510S1 and the second through hole 1510S2 may each include four through holes.

Meanwhile, a first terminal electrode T1 and a second terminal electrode T2 disposed to be spaced apart from each other are disposed on the second area A2 disposed at one side of the first area A1 of the first substrate 1212 of each thermoelectric module, and the first connector 210 and the second connector 220 are disposed on the first terminal electrode T1 and the second terminal electrode T2, respectively. The first connector 210 and the second connector 220 have different polarities, and thus form an electrical passage through the first connector 210, the first terminal electrode T1, the plurality of first electrodes, the plurality of thermoelectric legs, the plurality of second electrodes, the second terminal electrode T2, and the second connector 220. Here, the first terminal electrode T1 and the second terminal electrode T2 may each be disposed to protrude from the first area A on the first substrate 1212 and disposed to be electrically connected to the plurality of electrodes on the first substrate 1212. That is, the first terminal electrode T1 and the second terminal electrode T2 may be disposed on an area, in which the plurality of first electrodes are not disposed, of the first substrate 1212.

In addition, the second connector 220 of the first thermoelectric module 1200-1 and the first connector 210 of the first thermoelectric module 1200-2 disposed adjacent to each other are connected by the electrical wire W.

As described above, the shield member 1510 is disposed to cover the first and second terminal electrodes T1 and T2 and the first and second connectors 210 and 220 in the second area A2 of the first substrate 1212. Therefore, it is possible to protect the inside of the thermoelectric element from external contaminants, moisture, and the second fluid and allow the second fluid to directly pass through the heat sink, thereby efficiently performing the heat exchange between the second fluid and the heat sink.

However, the temperature of the first fluid flowing through the inside of the fluid flow part may be lower than the temperature of the second fluid passing through the heat sink of the thermoelectric module 1200 disposed outside the fluid flow part. Therefore, due to the temperature difference between the first fluid and the second fluid, condensation due to a condensation phenomenon may occur near the first and second connectors 210 and 220, resulting in a problem that an electrical short between the first and second connectors 210 and 220 occurs.

The embodiment of the present invention is intended to prevent the electrical short between the first and second connectors 210 and 220 using the structure of the shield member.

Figure 13:
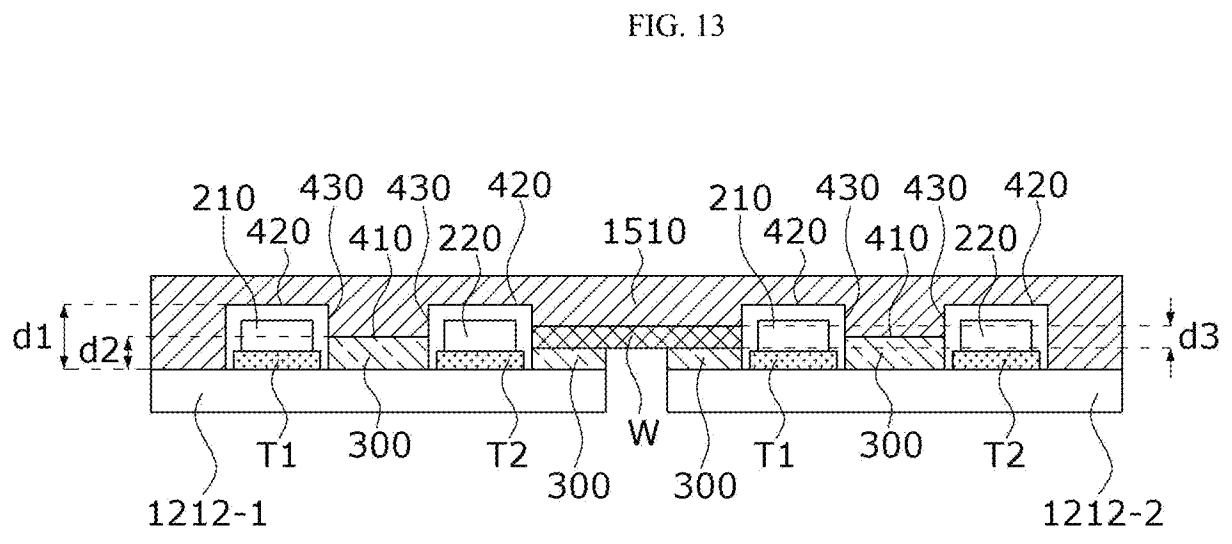
Figure 14:
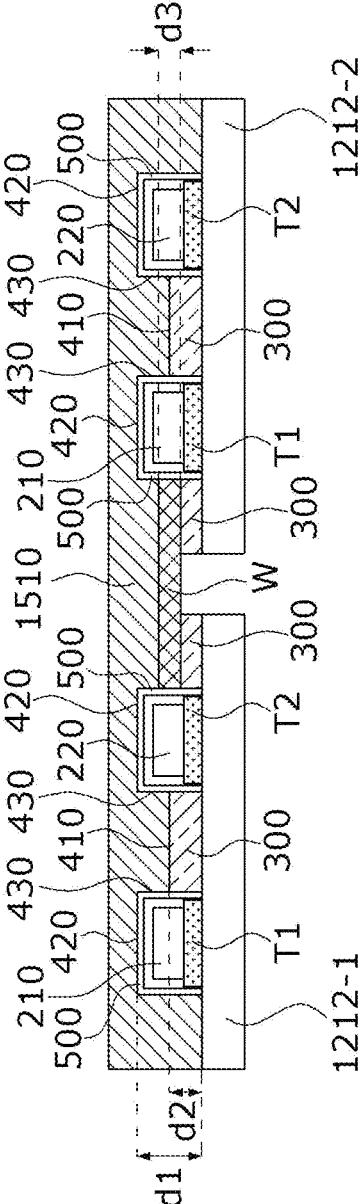
Figure 15:
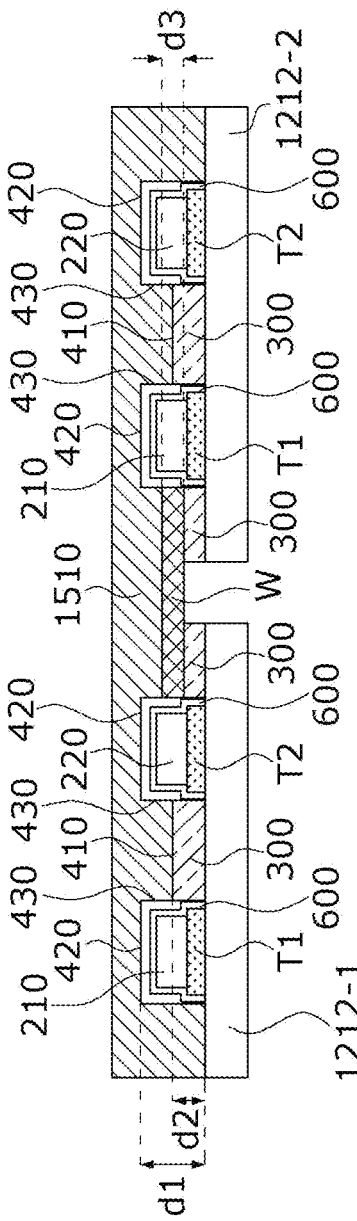

FIGS. 13 to 15 are cross-sectional views of the thermoelectric device according to the embodiment of the present invention. To help understanding, FIGS. 13 to 15 may be cross-sections of area R of FIG. 8.

Referring to FIGS. 13 to 15, the first substrate 1212-1 of the first thermoelectric module 1200-1 and the first substrate 1212-2 of the second thermoelectric module 1200-2 are disposed side by side. For convenience of description, contents commonly applied to the first thermoelectric module 1200-1 and the second thermoelectric module 1200-2 will be described focusing on the first thermoelectric module 1200-1.

The first terminal electrode T1 and the second terminal electrode T2 are disposed to be spaced apart from each other on the second area A2 of the first substrate 1212-1, the first connector 210 and the second connector 220 are disposed on the first terminal electrode T1 and the second terminal electrode T2, respectively, and the shield member 1510 is disposed to cover the first connector 210 and the second connector 220 on the second area A2 of the first substrate 1212-1.

According to the embodiment of the present invention, the shield member 1510 may be made of an insulating material. For example, the shield member 1510 may be made of insulating plastic, Teflon, etc. Therefore, since the weight of the shield member 1510 is light, it is possible to reduce the total weight of the thermoelectric device and prevent the electrical short due to condensed water near the shield member 1510, and since heat of the hot second fluid flowing along an outer surface of the shield member 1510 is not transferred to an inner surface of the shield member 1510, it is possible to minimize the possibility that the condensed water occurs in the area between the inner surface of the shield member 1510 and the first connector 210 and the second connector 220.

According to the embodiment of the present invention, a distance d1 between the first substrate 1212-1 and the shield member 1510 on the area in which the first terminal electrode T1 and the second terminal electrode T2 are disposed is greater than a distance d2 between the first substrate 1212-1 and the shield member 1510 between the first terminal electrode T1 and the second terminal electrode T2.

That is, since the shield member 1510 includes first protruding parts protruding toward the first substrates 1212-1 and 1212-2 from an area corresponding to an area between the first terminal electrode T1 and the second terminal electrode T2, the possibility of an electrical short occurring between the first terminal electrode T1 and the second terminal electrode T2 can be reduced.

According to the embodiment of the present invention, due to the first protruding part, a distance between the first substrate 1212-1 and the shield member 1510 in a direction perpendicular to the first substrate 1212-1 in the area in which the plurality of first electrodes are disposed may be greater than that in the area corresponding to the area between the first terminal electrode T1 and the second terminal electrode T2. Here, the direction perpendicular to the first substrate 1212-1 may refer to a direction perpendicular to an upper surface of the first substrate 1212-1. That is, the first substrate 1212-1 may include an upper surface, a lower surface opposite to the upper surface, and side surfaces between the upper surface and the lower surface, and the upper surface and the lower surface may be defined as a surface having a greater area than the side surface. Therefore, the direction perpendicular to the first substrate 1212-1 may be represented by a direction perpendicular to the wide surface of the first substrate 1212-1.

More specifically, the shield member 1510 may be bonded to the first substrate 1212-1 between the first connector 210 disposed on the first terminal electrode T1 and the second connector 220 disposed on the second terminal electrode T2 through a bonding layer 300. To this end, the inner surface of the shield member 1510 may include a first area 410 disposed parallel to the first substrate 1212-1 between the first connector 210 and the second connector 220, a second area 420 disposed parallel to the first substrate 1212-1 on the first connector 210 and the second connector 220, and a third area 430 disposed parallel to the side surfaces of the first connector 210 and the second connector 220 between the first area 410 and the second area 420, in which the first area 410 and the third area 430 may form the first protruding part, and the bonding layer 300 may be disposed between the first area 410 of the first protruding part and the first substrate 1212-1.

Since the bonding layer 300 includes at least one of an epoxy resin and a silicone resin and the first connector 210 disposed on the first terminal electrode T1 and the second connector 220 disposed on the second terminal electrode T2 are blocked by the bonding layer 300, it is possible to solve the problem that the electrical short occurs between the first connector 210 and the second connector 220 due to the condensed water generated at the first connector 210 and the condensed water generated at the second connector 220.

In this case, a height of the bonding layer 300 with respect to the first substrate 1212-1 may be greater than heights of the first terminal electrode T1 and the second terminal electrode T2. That is, the height of the bonding layer 300 in a direction perpendicular to the first substrate 1212-1 may be greater than the heights of the first terminal electrode T1 or the second terminal electrode T2. Here, the direction perpendicular to the first substrate 1212-1 may refer to a direction perpendicular to an upper surface of the first substrate 1212-1. That is, the first substrate 1212-1 may include an upper surface, a lower surface opposite to the upper surface, and side surfaces between the upper surface and the lower surface, and the upper surface and the lower surface may be defined as a surface having a greater area than the side surface. Therefore, the direction perpendicular to the first substrate 1212-1 may be represented by a direction perpendicular to the wide surface of the first substrate 1212-1. Therefore, even when the condensed water occurs at the first terminal electrode T1 side or the second terminal electrode T2 side, there is no concern that the condensed water flows to another terminal electrode having a different polarity, and thus it is possible to prevent the electric short due to the condensed water.

Meanwhile, according to the embodiment of the present invention, the second area 420 and the third area 430 of the inner surface of the shield member 1510 may be spaced apart from the first connector 210 and the second connector 220. Therefore, since the hot second fluid flowing along the outer surface of the shield member 1510 is not in direct contact with the first connector 210 and the second connector 220, it is possible to prevent overheating of the first connector 210 and the second connector 220, minimize the possibility of the generation of condensed water near the first connector 210 and the second connector 220 according to the temperature difference between the fluid flow part and the shield member, and reduce the possibility of the electrical short due to contact between the shield member 1510 and the first and second connectors 210 and 220.

Meanwhile, referring to FIG. 14, an insulating layer 500 may be disposed on the second area 420 and the third area 430 of the inner surface of the shield member 1510. The insulating layer 500 may include at least one of an epoxy resin and a silicone resin and may be disposed to be coated on the inner surface of the shield member 1510. Therefore, it is possible to minimize the influence of the hot second fluid flowing along the outer surface of the shield member 1510 on the first connector 210 and the second connector 220 and minimize the possibility of the electrical short due to the contact between the shield member 1510 and the first and second connectors 210 and 220.

Meanwhile, referring to FIG. 15, a layer 600 for molding each of the first connector 210 and the second connector 220 may be further disposed on each of the first connector 210 and the second connector 220. In this case, a partition wall structure of the shield member may be selectively present or omitted. The layer 600 may include a first layer disposed on each of the first connector 210 and the second connector 220, and a second layer disposed on the first layer, one of the first layer and the second layer may contain an epoxy resin, and the other may contain a silicone resin. As described above, when the first connector 210 and the second connector 220 are double molded, not only it is possible to block the possibility of the electrical short between the first connector 210 and the second connector 220 but also to reduce the possibility of the generation of the condensed water due to insulation near the first connector 210 and the second connector 220. The layers may be used interchangeably with a molding part.

Meanwhile, referring to FIGS. 13 to 15, the second connector 220 of the first thermoelectric module 1200-1 and the first connector 210 of the second thermoelectric module 1200-2 may be connected by the electrical wire W. Therefore, an electrical passage is formed through the first connector 210, the first terminal electrode T1, the plurality of first electrodes, the plurality of thermoelectric legs, the plurality of second electrodes, and the second terminal electrode T2, and the first connector 210, the first terminal electrode T1, the plurality of first electrodes, the plurality of thermoelectric legs, the plurality of second electrodes, the second terminal electrode T2, and the second connector 220 of the second thermoelectric module 1200-2.

In this case, the distance d1 between the first substrate 1212-1 and the shield member 1510 on the area in which the second terminal electrode T2 of the first thermoelectric module 1200-1 or the first terminal electrode T1 of the second thermoelectric module 1200-2 is disposed is greater than a distance d3 between the first substrate 1212-1 and the shield member 1510 between the second terminal electrode T2 of the first thermoelectric module 1200-1 and the first terminal electrode T1 of the second thermoelectric module 1200-2. That is, the shield member 1510 includes second protruding parts protruding toward the substrates 1212-1 and 1212-2 in an area corresponding to an area between the first thermoelectric module 1200-1 and the second thermoelectric module 1200-2, for example, the area corresponding to the area between the second terminal electrode T2 of the first thermoelectric module 1200-1 and the first terminal electrode T1 of the second thermoelectric module 1200-2.

That is, the inner surface of the shield member 1510 may be in contact with the electrical wire W between the second terminal electrode T2 of the first thermoelectric module 1200-1 and the first terminal electrode T1 of the second thermoelectric module 1200-2. That is, the second protruding part may be in contact with the electrical wire W connecting the first thermoelectric module 1200-1 with the second thermoelectric module 1200-2. In addition, the bonding layer 300 may be disposed between the electrical wire W and the substrates 1212-1 and 1212-2.

Therefore, it is possible to reduce the possibility of the occurrence of the electrical short according to the movement of the condensed water between the second terminal electrode T2 of the first thermoelectric module 1200-1 and the first terminal electrode T1 of the second thermoelectric module 1200-2.

Throughout the specification, although the thermoelectric elements 100 and 1210 are described as including the first substrate 110, the first electrode 120, the P-type thermoelectric leg 130, the N-type thermoelectric leg 140, the second electrode 150, and the second substrate 160, the definition of the thermoelectric elements 100 and 1210 is not limited thereto, and the thermoelectric elements 100 and 1210 may include the first electrode 120, the P-type thermoelectric leg 130, the N-type thermoelectric leg 140, the second electrode 150, and the second substrate 160 and mean as being disposed on the first substrate 110.

The power generation system may generate power through heat sources generated from vessels, vehicles, power plants, geothermal heat, or the like and include a plurality of power generation devices arranged to efficiently converge the heat sources. In this case, in each power generation device, it is possible to improve the cooling performance of the low-temperature part of the thermoelectric element by improving the bonding strength between the thermoelectric module and the fluid flow part, thereby improving the efficiency and reliability of the power generation device and thus improving the fuel efficiency of the transportation such as vessels or vehicles. Therefore, in the shipping and transportation industry, it is possible to reduce transportation costs, create an eco-friendly industry environment, and reduce material costs and the like when applied to a manufacturing industry such as a steel mill.

Although the present invention has been described above with reference to exemplary embodiments, those skilled in the art will understand that the present invention may be modified and changed variously without departing from the spirit and scope of the present invention as described in the appended claims.

The invention claimed is:

1. A thermoelectric device comprising:
a duct;
a first thermoelectric module disposed on the duct and including a thermoelectric element;
a shield member disposed on the first thermoelectric module; and
a bonding layer,
wherein the first thermoelectric module includes:
  a first substrate;
  a first electrode part disposed on the first substrate;
  a semiconductor element part disposed on the first electrode part;
  a second electrode part disposed on the semiconductor element part;
  a second substrate disposed on the second electrode part; and
  a first terminal electrode and a second terminal electrode that are disposed on an area of the first substrate in which the first electrode part is not disposed,
wherein an inner surface of the shield member includes a first concave part disposed on the first terminal electrode, a second concave part disposed on the second terminal electrode, and a first protruding part protruding toward the first substrate between the first concave part and the second concave part,
wherein the bonding layer bonds the first protruding part and the first substrate between the first terminal electrode and the second terminal electrode, and
wherein a height of bonding layer in a direction perpendicular to the first substrate is greater than a height of the first terminal electrode or the second terminal electrode.

2. The thermoelectric device of claim 1, wherein the bonding layer includes at least one of an epoxy resin and a silicon resin.

3. The thermoelectric device of claim 1, wherein a distance between the first substrate and the shield member in a direction perpendicular to the first substrate in an area in which the first electrode part is disposed is greater than that in the area corresponding to an area between the first terminal electrode and the second terminal electrode.

4. The thermoelectric device of claim 1, wherein polarities of the first terminal electrode and the second terminal electrode are different from each other.

5. The thermoelectric device of claim 1, further comprising a second thermoelectric module disposed adjacent to the first thermoelectric module and including a third terminal electrode and a fourth terminal electrode,
wherein the shield member is disposed on the second thermoelectric module, and
the shield member includes a second protruding part protruding from an area corresponding to an area between the first thermoelectric module and the second thermoelectric module.

6. The thermoelectric device of claim 5, wherein the second protruding part is disposed on an electrical wire connecting the first thermoelectric module with the second thermoelectric module.

7. The thermoelectric device of claim 1, wherein
the first thermoelectric module further includes a first connector disposed on the first terminal electrode and a second connector disposed on the second terminal electrode, and
the first concave part and the second concave part are spaced apart from the first connector and the second connector.

8. The thermoelectric device of claim 7, wherein an insulating layer is disposed on the first concave part and the second concave part.

9. The thermoelectric device of claim 8, wherein the insulating layer includes at least one of an epoxy resin and a silicon resin.

10. The thermoelectric device of claim 1, wherein the first thermoelectric module further includes a first connector disposed on the first terminal electrode and a second connector disposed on the second terminal electrode, and further includes a first layer disposed on each of the first connector and the second connector and a second layer having a material different from that of the first layer and disposed on the first layer.

11. The thermoelectric device of claim 10, wherein one of the first layer and the second layer includes an epoxy resin, and the other of the first layer and the second layer includes a silicon resin.

12. The thermoelectric device of claim 1, wherein the first thermoelectric module further includes a first connector disposed on the first terminal electrode and a second connector disposed on the second terminal electrode, and further includes a layer molding on each of the first connector and the second connector.

13. The thermoelectric device of claim 1, wherein the first thermoelectric module further includes a heat sink disposed on the thermoelectric element.

14. The thermoelectric device of claim 1, wherein the shield member is made of an insulating material.

* * * * *